(12) United States Patent
Liu et al.

(10) Patent No.: US 7,825,512 B2
(45) Date of Patent: Nov. 2, 2010

(54) ELECTRONIC PACKAGE WITH COMPLIANT ELECTRICALLY-CONDUCTIVE BALL INTERCONNECT

(75) Inventors: Weifeng Liu, Roseville, CA (US); John J. Lewis, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 420 days.

(21) Appl. No.: 11/224,919

(22) Filed: Sep. 12, 2005

(65) Prior Publication Data

US 2007/0057382 A1   Mar. 15, 2007

(51) Int. Cl.
*H01L 23/48* (2006.01)
*H01L 21/44* (2006.01)
*B23K 31/02* (2006.01)

(52) U.S. Cl. .............. 257/738; 257/772; 257/779; 257/781; 257/E23.021; 257/E23.033; 257/E23.069; 438/613; 228/180.22

(58) Field of Classification Search .............. None
See application file for complete search history.

(56) References Cited

U.S. PATENT DOCUMENTS

| | | | | |
|---|---|---|---|---|
| 5,060,844 | A | * | 10/1991 | Behun et al. ............ 228/180.21 |
| 5,394,497 | A | | 2/1995 | Erdman et al. |
| 5,527,591 | A | | 6/1996 | Crotzer et al. |
| 5,600,099 | A | | 2/1997 | Crotzer et al. |
| 5,726,502 | A | * | 3/1998 | Beddingfield .............. 257/797 |
| 5,783,870 | A | * | 7/1998 | Mostafazadeh et al. ..... 257/791 |
| 6,072,700 | A | | 6/2000 | Nam |
| 6,177,729 | B1 | * | 1/2001 | Benenati et al. ............ 257/738 |
| 6,259,036 | B1 | * | 7/2001 | Farnworth .................. 174/260 |
| 6,340,113 | B1 | * | 1/2002 | Avery et al. .............. 228/248.5 |
| 6,365,973 | B1 | * | 4/2002 | Koning ...................... 257/772 |
| 6,465,745 | B1 | | 10/2002 | Fontacha et al. |
| 6,515,354 | B1 | | 2/2003 | Fontecha et al. |
| 6,938,815 | B2 | * | 9/2005 | Li ............................ 228/56.3 |
| 6,940,168 | B2 | * | 9/2005 | Garrity et al. .............. 257/738 |
| 2004/0177997 | A1 | * | 9/2004 | Hata et al. .................. 174/257 |
| 2007/0145603 | A1 | * | 6/2007 | Jeong ......................... 257/778 |

* cited by examiner

*Primary Examiner*—Alonzo Chambliss

(57) ABSTRACT

An electronic device comprises a device substrate, a plurality of compliant electrically-conductive balls, and a plurality of solder joints that couple the compliant electrically-conductive balls to the device substrate by a reflow process.

12 Claims, 13 Drawing Sheets

ELECTRONIC PACKAGE WITH COMPLIANT ELECTRICALLY-CONDUCTIVE BALL INTERCONNECT

BACKGROUND OF THE INVENTION

Driven by increased performance and high input/output (I/O) pin density, the paradigm of electronic packaging has shifted from perimeter-leaded packages to area array packages. For area array packages such as ball grid arrays (BGAs) and chip-scale packages (CSP), arrays of solder balls are attached to the bottom of a substrate. During assembly, packages are generally placed on circuit boards and processed using a reflow cycle, applied at a relatively high temperature that melts solder alloy. Typical reflow temperatures are approximately 220° C. for tin-lead (SnPb) eutectic alloy and 260° C. for lead-free tin-silver-copper (SAC) alloy with a composition Sn3.9Ag0.7Cu. Other temperatures may be suitable and other alloys, processed at suitable temperatures, may be used. Samples are cooled and the solder alloys hold the package in place.

One difficulty that may arise with conventional packages is that, since solder balls rigidly hold packages to the printed circuit boards, coefficient of thermal expansion (CTE) mismatch between the package and the printed circuit board may create thermo-mechanical stresses on the solder joint during temperature cycling, which may eventually cause solder joints to crack.

Another difficulty is that the solder joint is a permanent connection. During design, testing, and troubleshooting stages of product development, a capability to swap packages may be desirable to determine root causes of system failures or glitches. If packages are soldered to the printed circuit board, troubleshooting is highly difficult or impossible without removing the array packages.

SUMMARY

In accordance with a system embodiment, an electronic device comprises a device substrate, a plurality of compliant electrically-conductive balls, and a plurality of solder joints that couple the compliant electrically-conductive balls to the device substrate by a reflow process.

BRIEF DESCRIPTION OF THE DRAWINGS

Embodiments of the invention relating to both structure and method of operation may best be understood by referring to the following description and accompanying drawings.

DETAILED DESCRIPTION

Figure 1A:
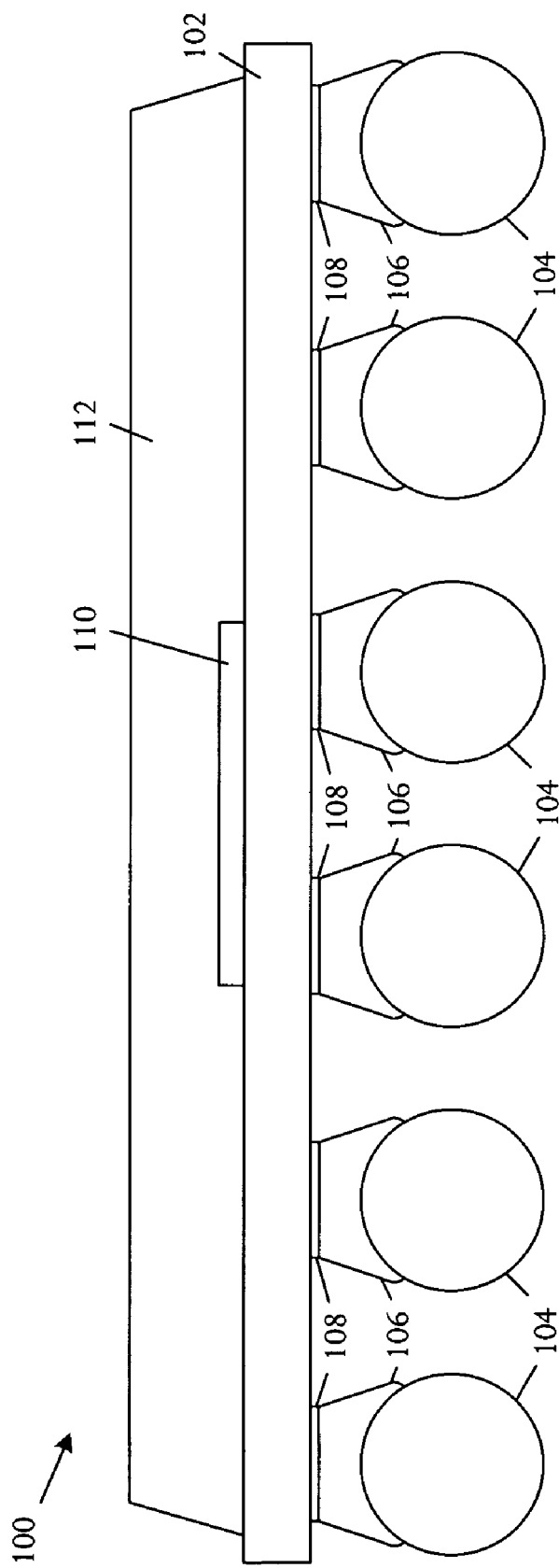
FIG. 1A is a frontal pictorial view illustrating an embodiment of an electronic package that is attached with compliant conductive balls.

A device package, for example an integrated circuit package, comprises compliant conductive balls attached to a package substrate. In a particular example, the compliant conductive balls may be affixed to a ball grid array (BGA) substrate, a highly popular packaging technology used in electronic assembly. In some embodiments, the balls may be constructed from elastomers or other highly pliable materials, which are plated with metals whereby the balls become conductive. In other embodiments, the balls may be made electrically-conductive by embedding metal particles in an elastomer matrix. Methods of constructing and integrating the device package enable selection of either permanent or temporary attachment of the package to a printed circuit board.

The disclosed device package enables improved reliability in comparison to conventional packages when attached to circuit boards with solder as a result of ball compliance which offsets thermo-mechanical stress caused by coefficient of thermal expansion (CTE) mismatch between the printed circuit board and the package.

The disclosed device package enables selective alternative usage in either permanent installations or temporary installations during design, testing, and troubleshooting stages of product development. In the temporary installation, the package may be pressed onto a printed circuit board without soldering, enabling package re-use many times to facilitate system test and debug. The capability for selective alternative usage enables a package, such as a ball grid array package, to meet requirements for system development whereby a package is removable and for system production whereby connection is substantially permanent.

The device package enables a common package configuration for both system bring-up and production. The device package eliminates a requirement to use a package style during system bring-up that may differ from a production package version. Furthermore, a device package using compliant elastomer balls can be directly compressed onto a circuit board to establish an electrical connection by application of external forces, eliminating a requirement to use a socket interposed between the device package and the circuit board. Accordingly, the disclosed device package addresses complexity in package characterization and logistic support, enabling support for package and attachment changes.

The device package facilitates attachment, enabling an improved-reliability interconnection between an electronic package, such as an integrated circuit package, and a printed circuit board. The interconnect is compliant or elastic, thereby offsetting coefficient of thermal expansion (CTE) mismatch when substantially permanently attached to the printed circuit board. The device package may be configured to enable detachment during system design, testing, and troubleshooting to facilitate package swapping and development. In the substantially permanent configuration, the device package may be soldered to the printed circuit board, typically using high temperature reflow process. In the detachable or temporary configuration, the device package may be pressed onto the printed circuit board by applying external forces compressing the package against the board. The illustrative package can thus be selectively attached to the board enabling a single array package to be used for both development and production purposes.

Referring to FIG. 1A, a frontal pictorial view illustrates an embodiment of an electronic package that is attached with compliant conductive balls. An electronic device 100 comprises a device substrate 102 and multiple compliant electrically-conductive balls 104. Multiple solder joints 106 couple the compliant electrically-conductive balls 104 to the device substrate 102 by a reflow solder process.

The electronic device 100 may further comprise multiple conductive pads 108 mounted on the device substrate 102. The conductive pads 108 are generally used to operate in combination with the solder joints 106 to physically and electrically connect the compliant electrically-conductive balls 104 to the device substrate 102.

The electronic package may be implemented according to any suitable technology such as ball grid array (BGA) packaging, chip scale packaging (CSP), and the like. In a typical embodiment, arrays of elastomer balls are attached to metal pads on the base of a BGA package substrate. The elastomer balls form a media of input/output (I/O) connections between internal package circuitry and external circuits. When the elastomer balls are attached to circuit boards, generally either through a soldering process or through external compression force, an electrical connection is established between the package and the printed circuit board.

The compliant electrically-conductive balls 104 may be made solderable by plating an elastomeric sphere with a metal layer, for example gold, gold over nickel, gold over nickel over copper, and others. To enhance electrical conductivity metal particles such as nickel, gold, silver, alloys, and others may also be embedded in the elastomeric spheres.

The illustrative electronic device 100 further comprises a device die 110 shown coupled to and abutting the device substrate 102. A cap 112, for example a molding compound or a metal lid, couples to the device substrate 102 and encloses the device die 110 in position abutting the device substrate 102.

The illustrative electronic device 100 is configured in ball grid array (BGA) package construction. The device 100 differs from conventional BGA packaging at least on the basis of usage of compliant and conductive elastomer balls.

Elastomer balls, either conductive or non-conductive, may be constructed in a conventional process typical for producing small, versatile, resilient elastomeric spheres used in applications such as check valves, indicators, and springs. For example, Vernay Laboratories, Inc. of Yellow Springs, Ohio, manufactures and sells V-Ball® elastomeric spheres that are suitable for usage in constructing the compliant electrically-conductive balls 104.

Elastomer ball diameter may be selected to suit the particular package construction application. Typical sizes of conventional ball grid array packages have balls in a range from 0.4 mm to 0.5 mm in diameter, although the illustrative packages may use balls of any suitable size, possibly very different from the standard range.

Compliance of the compliant electrically-conductive balls 104 may have any suitable value or range of values to compensate for any non-coplanarities of the package substrate and the printed circuit board when directly attached under external forces. Compliance is typically to be selected based on the particular package application.

In some embodiments, the compliant electrically-conductive balls 104 may be constructed with selected conductive properties by coating elastomer spheres, either originally conductive or non-conductive, with a metal plating layer on the sphere surface. Different metal platings may be used, for example silver, copper, gold, palladium, nickel, various alloys, solder, and combinations of the various platings. In one example, elastomer balls may be plated with a layer of copper and then a layer of gold to reduce copper exposure to an external hostile environment. Various plating processes may be used such as electroless, electrolytic, and sputtering. For an electroless process, elastomer balls are immersed in a chemical solution and no external current or bias is applied, causing a uniform metal layer to be deposited on the elastomer surface through the chemical reduction reaction within the solution.

The metal platings form an electrically-conductive path between package circuitry and printed circuit board circuitry.

In still other embodiments, the compliant electrically-conductive balls 104 may be made conductive both by embedding conductive metal particles into the elastomer spheres and by coating the embedded or doped spheres with a conductive metal layer.

Once the elastomer balls are fabricated and plated, the compliant electrically-conductive balls 104 are attached to the package substrate 102, typically using a reflow process. A conventional process to attach solder balls can be applied for attaching the compliant electrically-conductive balls 104.

The electronic device 100 may be constructed using various techniques. For example, compliant elastomer balls having suitable resilient properties may be plated with one or more conductive layers, such as conductive metal layers, to form compliant electrically-conductive balls 104. Typically, solder paste with a controlled volume is applied on individual pads 108 on the substrate 102. The plated elastomer balls are placed on the solder paste on the individual pads on the device substrate 102. A mold with appropriate arrangement of cavities may be attached to the device substrate 102. The cavities are aligned with the conductive pads 108 on the device substrate 102 and the elastomer balls 104 placed on the solder paste on the individual pads 108. Compliant electrically-conductive balls 104 may be reflow-soldered to affix the compliant electrically-conductive balls 104 to the conductive pads 108 on the device substrate 102. The entire configuration may be passed through a reflow oven. The reflow process is applied with controlled profile and temperature limits to melt the solders. Once the package has cooled, the solders permanently connect the elastomer balls to the individual pads on the ball grid array substrate 102. In typical arrangements, the solders may be tin-lead eutectic or lead-free solder such as tin-silver-copper (SAC) alloy, although any suitable solder may be used.

Figure 1B:
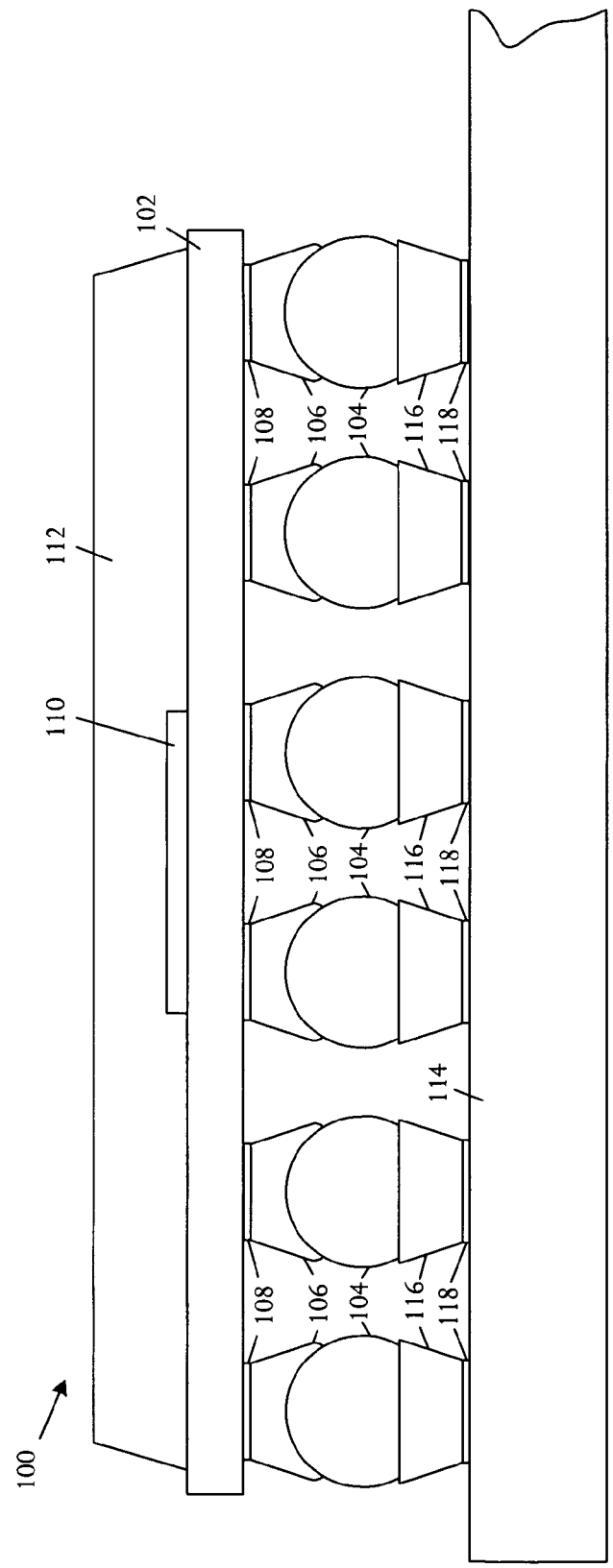
FIG. 1B is a frontal pictorial view depicting an embodiment of the electronic package which is configured to facilitate a permanent attachment to a printed circuit board.

The electronic device 100 is configured to enable either permanent or temporary connection to a printed circuit board. For example, the electronic device 100 may be affixed by soldering the multiple compliant elastomer balls to the printed circuit board as shown in FIG. 1B, generally for usage in a production stage. In other arrangements, the electronic device 100 may be temporarily attached to the printed circuit board by clamping the device substrate 102 to a printed circuit board whereby the compliant elastomer balls are compressed against conductive pads on the printed circuit board as shown in FIG. 1C, typically for usage in a development stage to facilitate design, testing, and troubleshooting.

Referring to FIG. 1B, a frontal pictorial view illustrates an embodiment of the electronic package configured to facilitate a permanent attachment to a printed circuit board. The electronic device 100 may connect to a printed circuit board 114 through a plurality of solder joints 116 configured to couple the compliant electrically-conductive balls 104 to the printed circuit board 114.

Figure 1C:
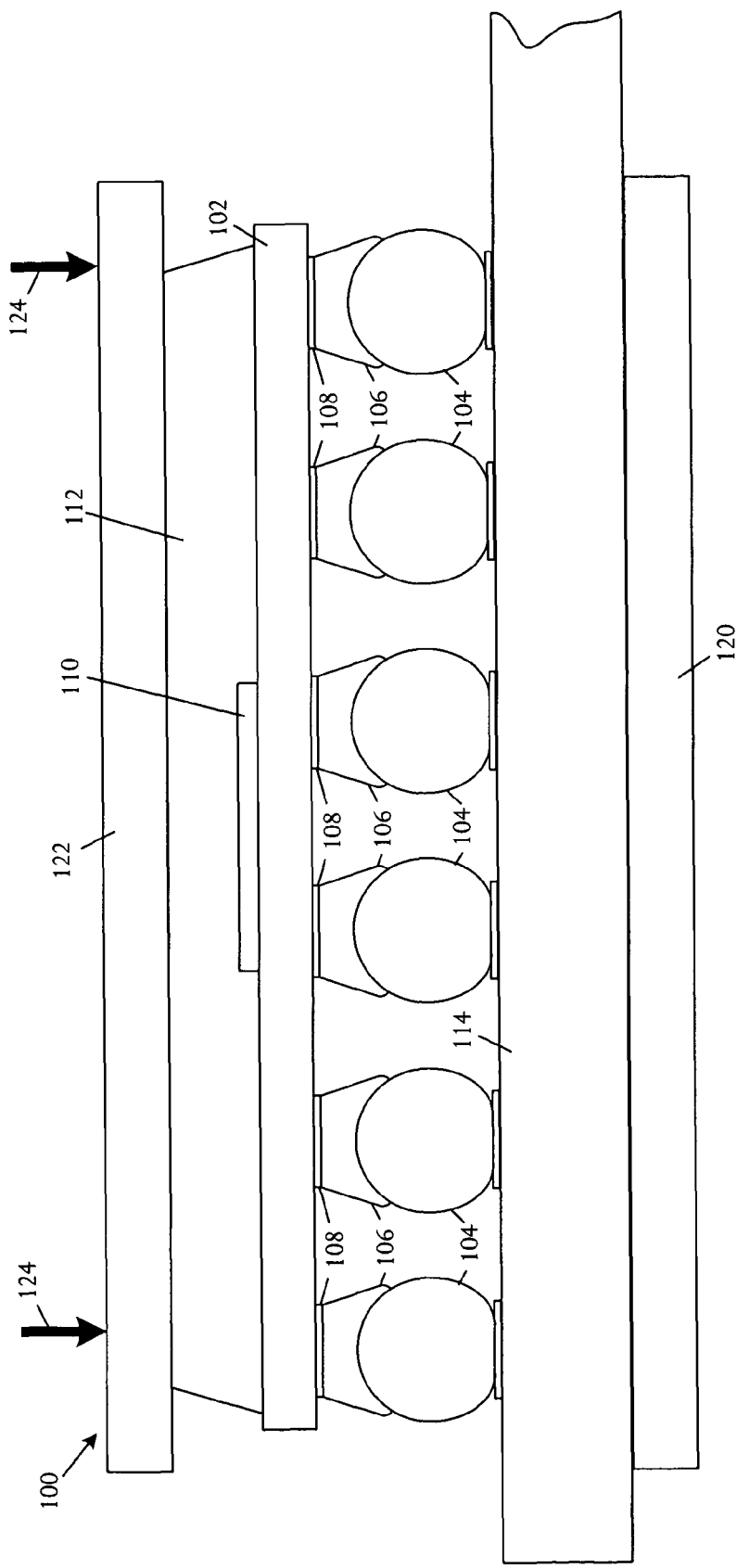
FIG. 1C is a frontal pictorial view showing an embodiment of the electronic package configured to facilitate a temporary attachment to a printed circuit board.

Referring to FIG. 1C, a frontal pictorial view illustrates an embodiment of the electronic package configured to facilitate a temporary attachment to a printed circuit board. The illustrative electronic device 100 connects to a printed circuit board 114. Multiple conductive pads 118 are mounted to the printed circuit board 114 and configured to electrically couple to the compliant electrically-conductive balls 104 on application of a compressive, clamping force that compresses the device substrate 102 against the printed circuit board 114. No solder is required to attach the compliant electrically-conductive balls 104 to the printed circuit board 114.

The electronic device 100 is shown compressed between a metal bolster 120 and upper metal plate 122 using a clamping force 124.

Figure 2:
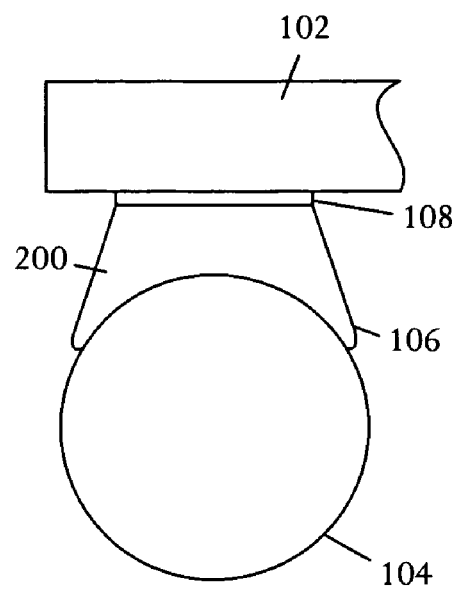
FIG. 2 is a pictorial diagram illustrating an enlarged view showing an embodiment of a connection of a compliant electrically-conductive ball to the device substrate.
Figure 3A:
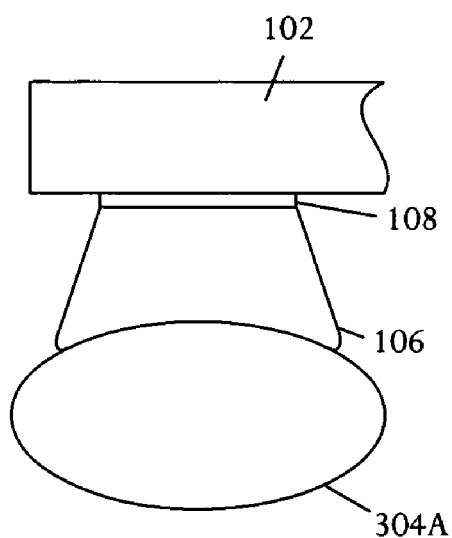
FIGS. 3A through 3E are pictorial diagrams showing various example shapes for embodiments of compliant electrically-conductive balls.
Figure 3B:
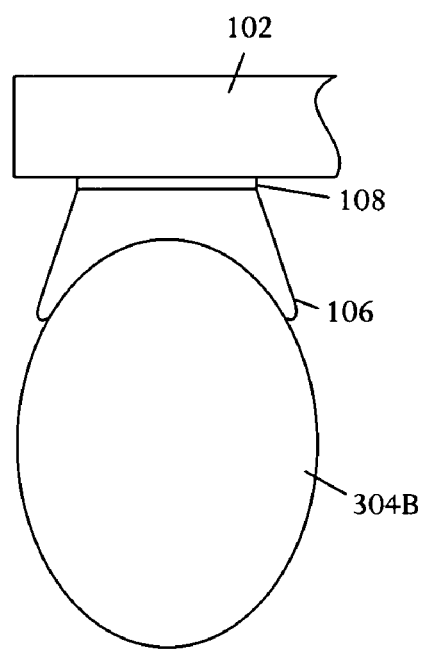
Figure 3C:
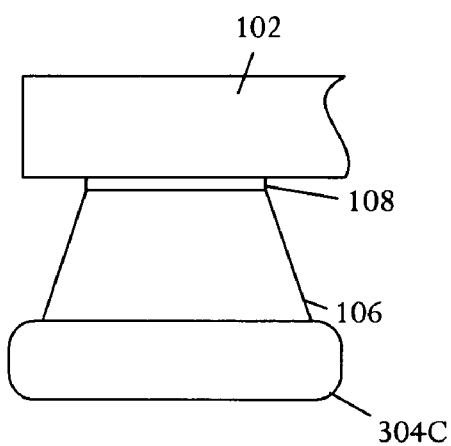
Figure 3D:
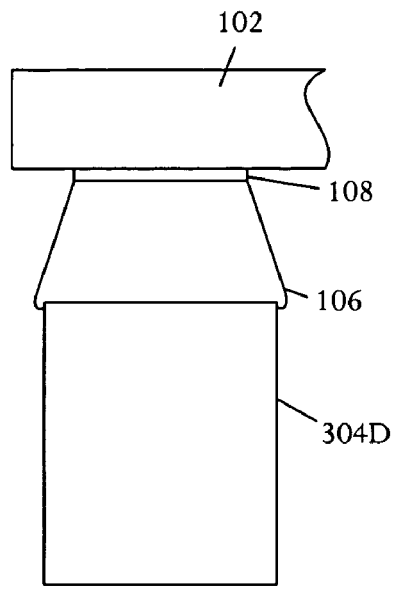
Figure 3E:
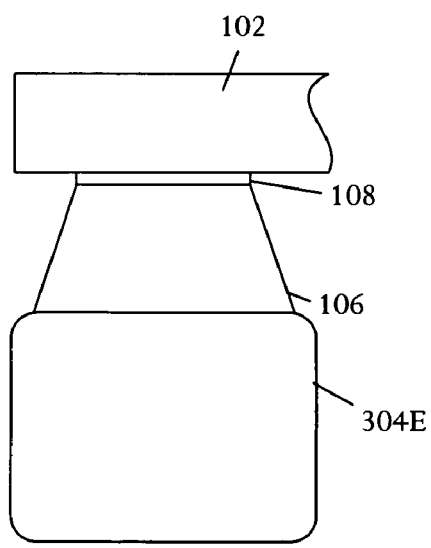

Referring to FIG. 2, a pictorial diagram illustrates an enlarged view showing an embodiment of a connection of a compliant electrically-conductive ball 104 to the device substrate 102. In one example of a suitable technique for connecting the compliant electrically-conductive balls 104 to the device substrate 102, the solder joints 106 are formed by printing solder paste 200 to the conductive pad 108 on the device substrate 102 and reflowing at an elevated temperature after the compliant balls 104 are placed on the solder paste 200. During the reflow process, a mold with cavities is used to hold the compliant electrically-conductive ball 104 to the solder paste 200 and conductive pad 108. The solder paste 200 is melted at a high temperature to form a substantially permanent solder joint 106 connecting the compliant electrically-conductive ball 104 to the pad 108 on the package substrate 102. The term "substantially permanent" for the solder joint refers to the condition of a generally a permanent interconnect under operating conditions that range from typical to even extreme operating conditions. A solder joint may be considered to be substantially permanent although breakable in some highly stressed conditions or when processes particularly selected to break the joint are performed.

Referring to FIGS. 2 and 3A through 3E, several pictorial diagrams illustrate embodiments of compliant electrically-conductive balls. The compliant electrically-conductive balls may have any suitable shape. Examples of suitable shapes include spheroids 104, ellipsoids 304A, ovoids 304B, discoids 304C, and columnar shapes such as tubular shapes 304D, and cylindrical shapes 304E as shown respectively in FIGS. 2, 3A, 3B, 3C, 3D, and 3E. In various embodiments, the compliant electrically-conductive balls or a particular electronic device typically have uniform shape and size. In less typical embodiments, the compliant electrically-conductive balls may have nonuniform shapes and sizes so long as the arrangement of electronic device and printed circuit board forms a suitable electrical connection.

Figure 4A:
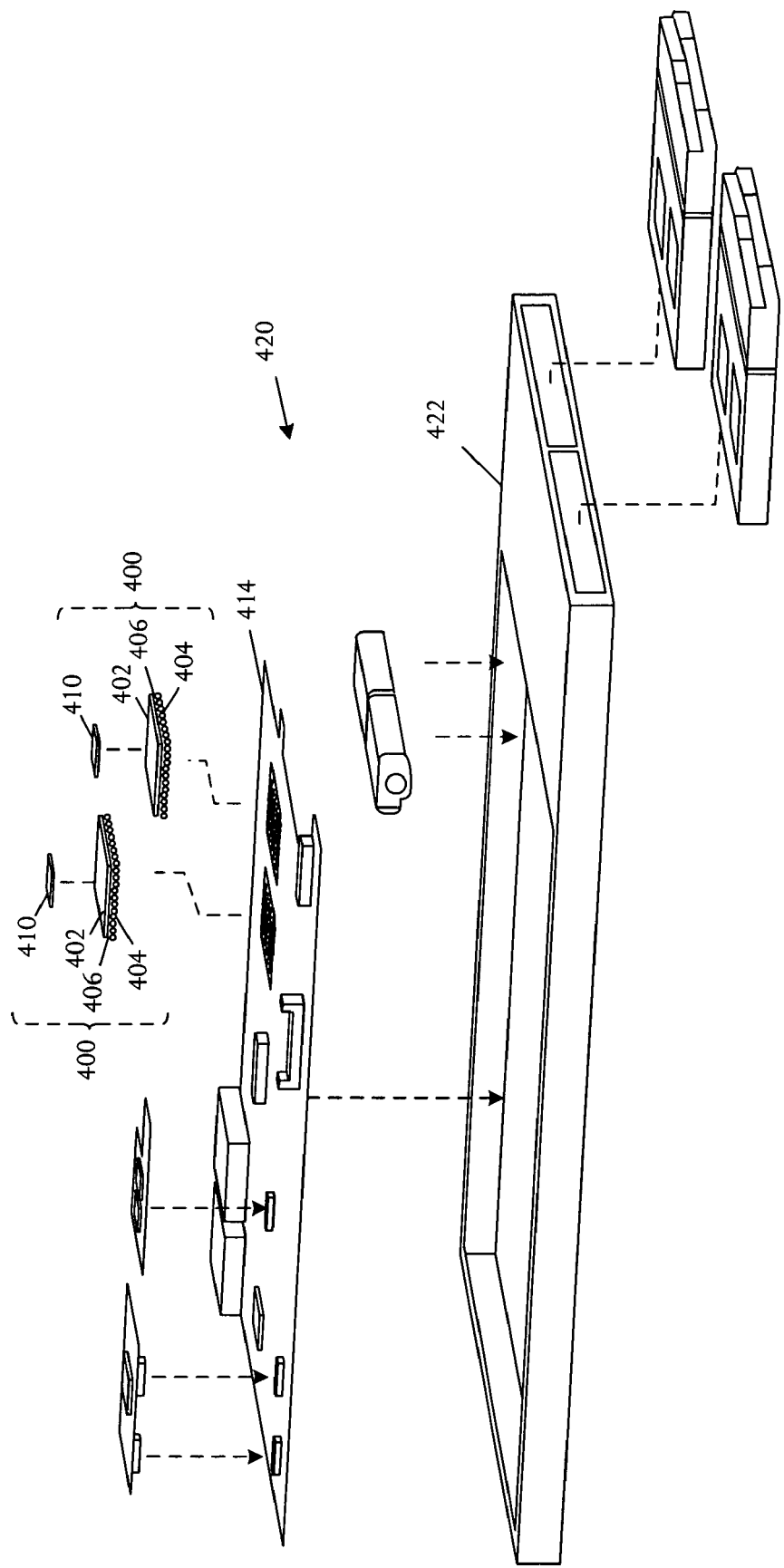
FIGS. 4A and 4B are exploded and combined perspective pictorial diagrams that illustrate an embodiment of an electronic system including one or more electronic packages attached using compliant electrically-conductive balls.
Figure 4B:
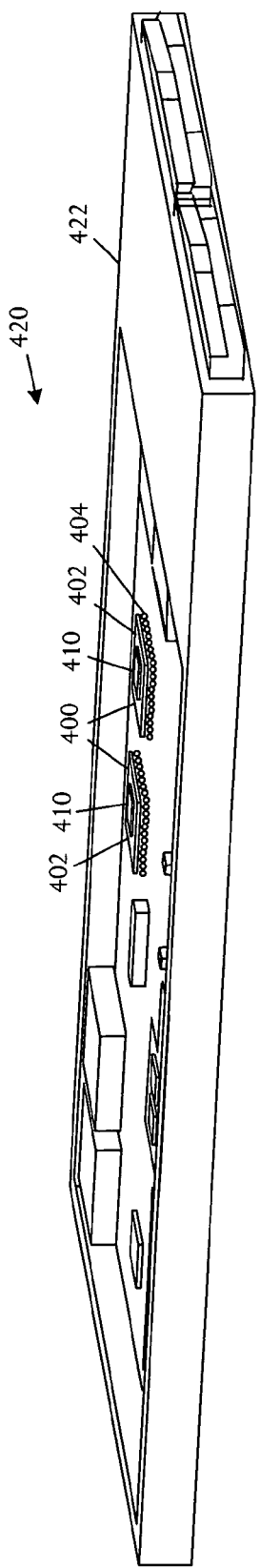

Referring to FIGS. 4A and 4B, exploded and combined perspective pictorial diagrams illustrate an embodiment of an electronic system that includes one or more electronic packages attached using compliant electrically-conductive balls. The electronic system 420 comprises a housing 422, a printed circuit board 414 mounted in the housing 422 and at least one integrated circuit 400 mounted on the circuit board 414. One or more of the integrated circuits 400 comprises an integrated circuit substrate 402, multiple conductive pads mounted to the integrated circuit substrate, and multiple compliant electrically-conductive balls 404. A plurality of solder joints 406 are configured to reflow-couple the compliant electrically-conductive balls 404 to the conductive pads on the electronic circuit substrate 402. The integrated circuits 400 further include integrated circuit dies 410 mounted onto the integrated circuit substrate 402.

The electronic system 420 may further comprise a connection adapted to electrically couple the integrated circuits 400 to the printed circuit board 414. The electronic system 420 may be configured with various different types of connections, depending upon whether the connection is intended to be permanent or temporary.

Referring to FIGS. 4A and 4B in combination with FIG. 1B, the connector may be optionally selected as a substantially permanent connection comprising multiple solder joints 106 coupling the compliant electrically-conductive balls 104 to the printed circuit board.

Referring to FIGS. 4A and 4B in combination with FIG. 1C, the connector may be optionally selected as a temporary connection comprising a clamp configured to compress an integrated circuit 400 against the printed circuit board 414 whereby the compliant electrically-conductive balls 104 are electrically coupled to the printed circuit board 414.

The illustrative electronic system 420 comprises compliant electrically-conductive balls 104 that are substantially permanently attached to the integrated circuit substrate 402, for example by a solder joint, enabling the integrated circuit 400 to be selectively affixed to conductive pads in the printed circuit board 414 either temporarily via an external force or substantially permanently through a soldering process. If the temporary connection is selected the elastomeric balls are separable from the printed circuit board pads. If the permanent connection is selected, a durable connection enables essentially maintenance-free operation.

The permanent connection of the integrated circuit 400 to the printed circuit board 414 enables the compliant electrically-conductive balls 104 to be held in place without additional walls or other structures interposed between the integrated circuit 400 and the printed circuit board 414.

Figure 5A:
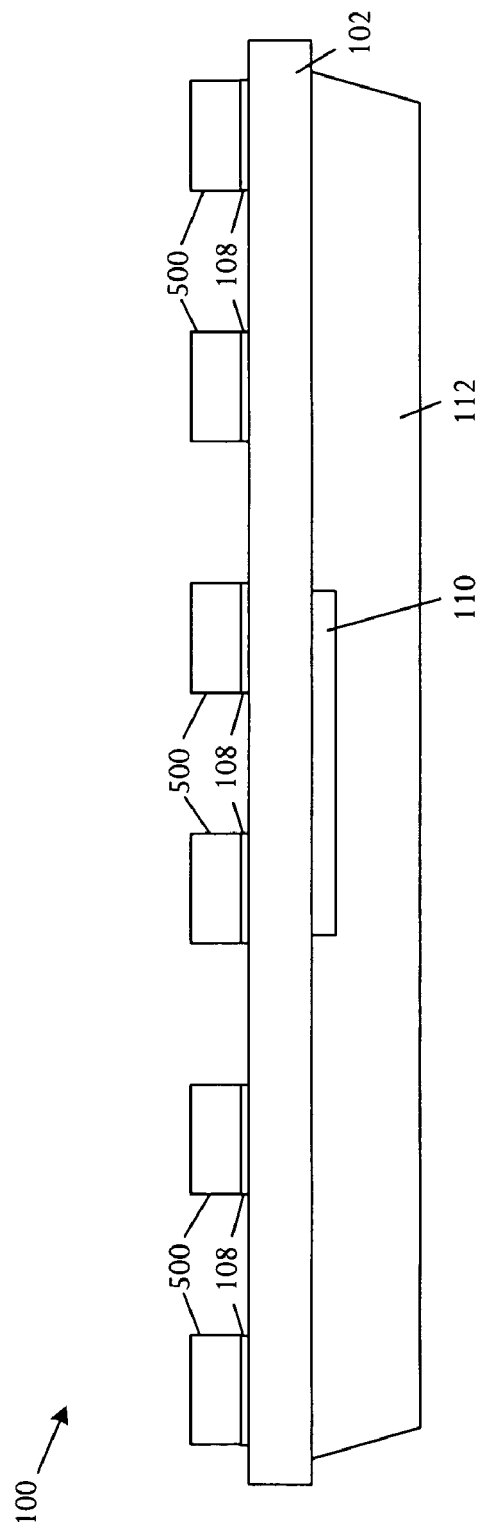
FIGS. 5A through 5E is a sequence of frontal pictorial views showing an embodiment of a process for attaching compliant electrically-conductive balls to an electronic device package.
Figure 5B:
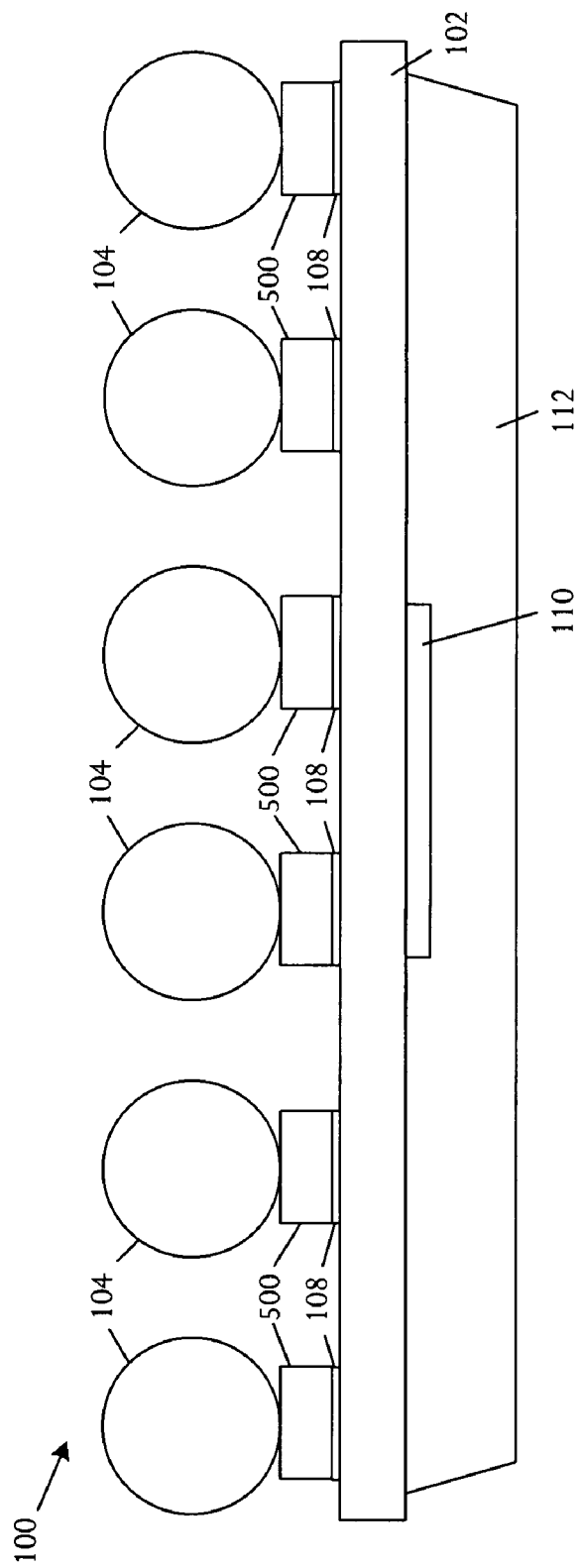
Figure 5C:
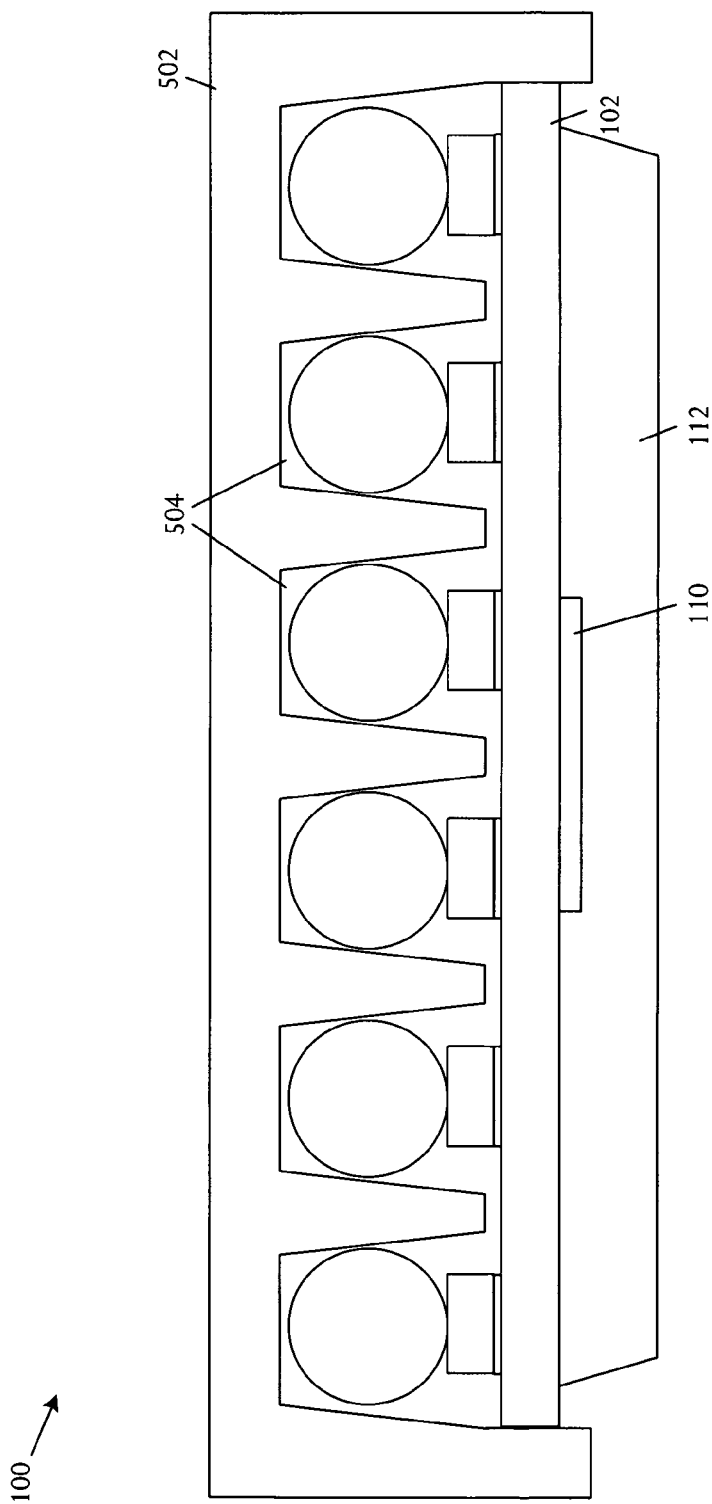
Figure 5D:
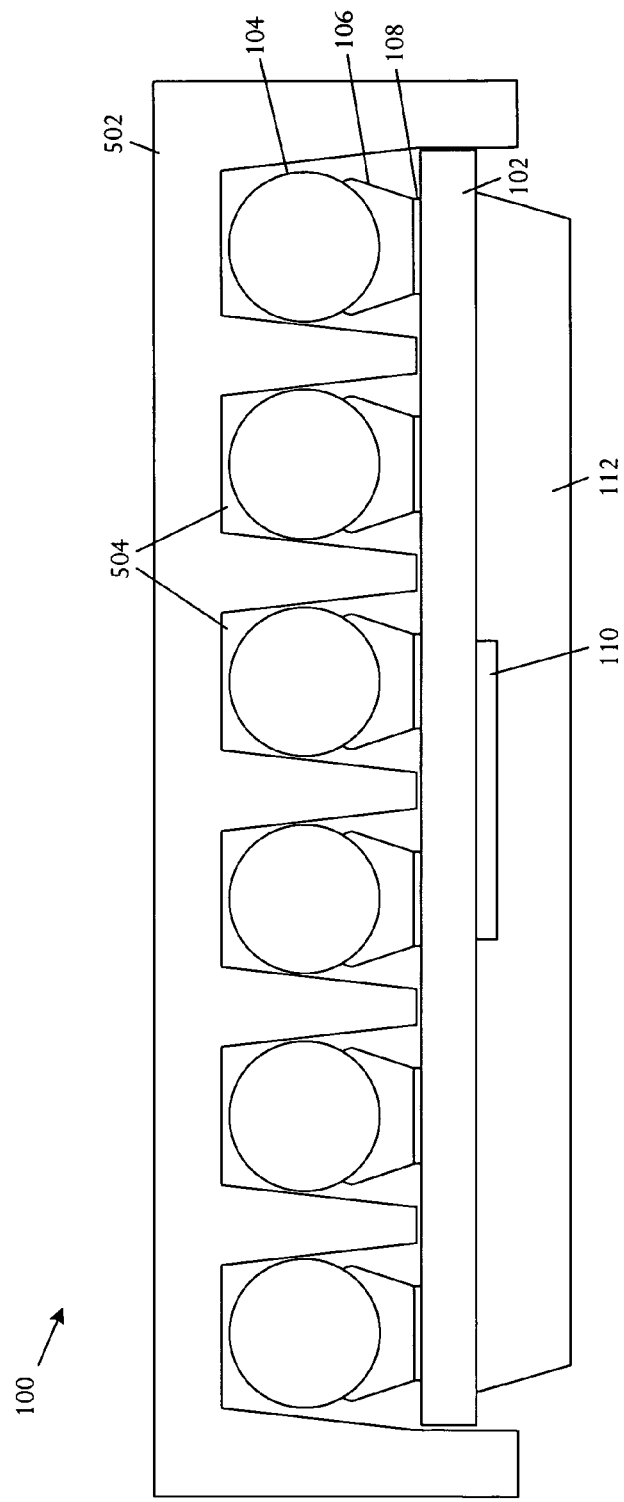
Figure 5E:
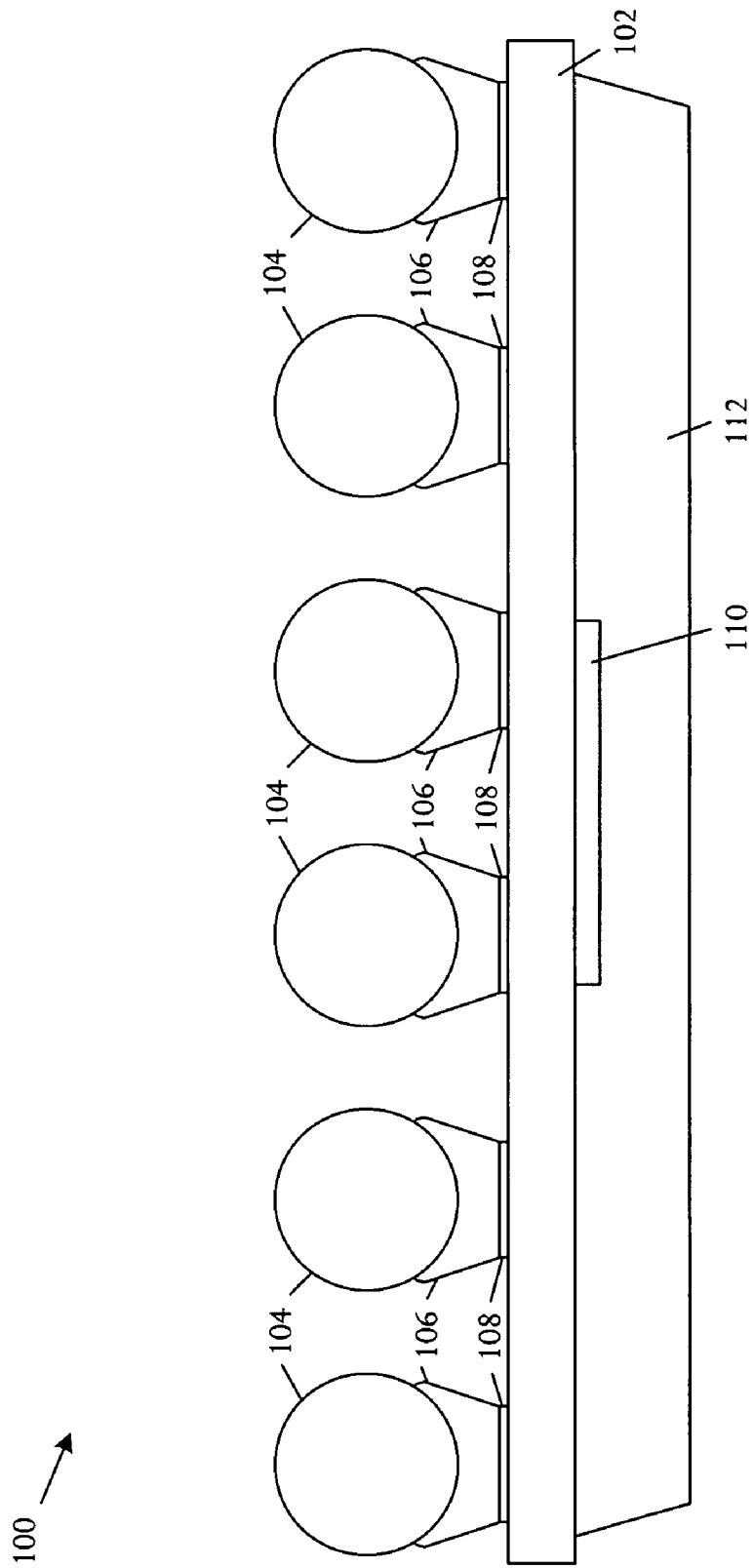

Referring to FIGS. 5A through 5E, a sequence of frontal pictorial views illustrates an embodiment of a process for attaching compliant electrically-conductive balls to an electronic device package 100. As shown in FIG. 5A, the electronic device package 100 is inverted and solder paste 500 is printed on the conductive metal pads 108. The solder paste 500 may be lead-free or tin-lead paste. The compliant electrically-conductive elastomer balls 104 are placed on the printed solder paste 500 as shown in FIG. 5B. A mold 502 with multiple cavities 504 formed in a configuration adapted to receive the elastomer balls 104 is aligned over the package substrate 102. The mold cavities 504 are aligned with the conductive pads 108 and the compliant balls 104 as shown in FIG. 5C. A solder reflow process transforms the solder paste 500 into solder joints 106, establishing a permanent connection between the elastomer balls 104 and the conductive pads 108, depicted in FIG. 5D. The mold is removed, leaving the electronic device package 100 shown in FIG. 5E with elastomer balls 104 permanently attached to the device substrate 102.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, packages and balls are shown with particular shapes, sizes, and configurations. The illustrative structures may be modified to any suitable shape, size and configuration. A specific example of electronic device structure is depicted. Any suitable arrangement or configuration of package, balls, and electronic systems may be implemented. The illustrative package may be used in any appropriate electronic system or device, such as suitable servers, computers, consumer electronics devices, communication systems and devices, storage system, and others.

In the claims, unless otherwise indicated the article "a" is to refer to "one or more than one."

What is claimed is:

1. An electronic device comprising:
   a device substrate;
   a plurality of compliant elastomeric electrically-conductive balls comprising balls formed from an elastomer matrix embedded with electrically-conductive metal particles the compliant elastomeric electrically conductive balls constructed from an elastomer with embedded conductive metal and enclosed in conductive metal plating; and
   a plurality of solder joints reflow-coupling the compliant elastomeric electrically-conductive balls to the device substrate.

2. The electronic device according to claim 1 further comprising:
   a plurality of conductive pads coupled to the device substrate and coupling the plurality of compliant elastomeric electrically-conductive balls to the device substrate in combination with the solder joint plurality.

3. The electronic device according to claim 1 further comprising:
   a device die coupled to the device substrate; and
   a cap coupled to the device substrate enclosing the device die in position abutting the device substrate.

4. The electronic device according to claim 1 further comprising:
   a printed circuit board; and
   a plurality of solder joints coupling the plurality of compliant elastomeric electrically-conductive balls to the printed circuit board.

5. The electronic device according to claim 1 further comprising:
   a printed circuit board; and
   a plurality of conductive pads coupled to the printed circuit board and configured to electrically couple to the plurality of compliant elastomeric electrically-conductive balls on application of a compressive force compressing the device substrate against the printed circuit board.

6. The electronic device according to claim 1 further comprising:
   a plurality of conductive pads coupled to the device substrate; and
   a plurality of solder joints permanently coupling the plurality of compliant elastomeric electrically-conductive balls to the plurality of conductive pads on the device substrate, the plurality of solder joints being formed by pre-applying solder paste on the conductive pads, placing the compliant elastomeric electrically-conductive balls on the solder paste and reflowing at a high temperature to melt the solder paste.

7. The electronic device according to claim 1 further comprising:
   a metal layer coated onto the compliant elastomeric electrically-conductive balls.

8. The electronic device according to claim 1 further comprising:
   the compliant elastomeric electrically-conductive balls have shapes selected from among a group of shapes consisting of spheroid, ellipsoid, ovoid, discoid, tubular, and cylindrical shapes.

9. The electronic device according to claim 1 further comprising:
   the compliant elastomeric electrically-conductive balls have mutually uniform shapes selected from among a group of shapes consisting of spheroid, ellipsoid, ovoid, discoid, tubular, and cylindrical shapes.

10. The electronic device according to claim 1 further comprising:
    the compliant elastomeric electrically-conductive balls constructed from conductive material.

11. An electronic system comprising:
    a housing;
    a printed circuit board mounted in the housing;
    at least one integrated circuit mounted in the housing comprising:
       an integrated circuit substrate;
       a plurality of conductive pads coupled to the integrated circuit substrate;
       a plurality of compliant elastomeric electrically-conductive balls comprising balls formed from an elastomer matrix embedded with electrically-conductive metal particles the compliant elastomeric electrically conductive balls constructed from an elastomer with embedded conductive metal and enclosed in conductive metal plating;
       a plurality of solder joints reflow-coupling the compliant elastomeric electrically-conductive balls to the conductive pads on the electronic circuit substrate; and
       an integrated circuit die coupled to the integrated circuit substrate.

12. The electronic system according to claim 11 further comprising:
    a connection adapted to electrically couple the at least one integrated circuit to the printed circuit board, the connection optionally selected from:
       a plurality of solder joints coupling the plurality of compliant elastomeric electrically-conductive balls to the printed circuit board; and
       a clamp configured to compress at least one integrated circuit against the printed circuit board whereby the plurality of compliant elastomeric electrically-conductive balls are electrically coupled to the printed circuit board.

* * * * *